United States Patent [19]

Plaettner et al.

[11] 4,292,343
[45] Sep. 29, 1981

[54] METHOD OF MANUFACTURING SEMICONDUCTOR BODIES COMPOSED OF AMORPHOUS SILICON

[75] Inventors: Rolf Plaettner, Ottobrunn; Wolfgang Kruehler, Unterhaching; Josef Grabmaier, Berg, all of Fed. Rep. of Germany

[73] Assignee: Siemens Aktiengesellschaft, Berlin and Munich, Fed. Rep. of Germany

[21] Appl. No.: 116,982

[22] Filed: Jan. 30, 1980

[30] Foreign Application Priority Data

Feb. 5, 1979 [DE] Fed. Rep. of Germany ....... 2904171

[51] Int. Cl.³ .............................................. C23C 11/00
[52] U.S. Cl. ......................................... 427/39; 427/86
[58] Field of Search ...................... 427/38, 39, 82, 84, 427/86; 357/2, 7, 15

[56] References Cited

U.S. PATENT DOCUMENTS

| | | | |
|---|---|---|---|
| 3,485,666 | 12/1969 | Sterling et al. | 427/39 |
| 4,064,521 | 12/1977 | Carlson | 427/39 |
| 4,151,058 | 4/1979 | Kaplan et al. | 427/39 |
| 4,196,438 | 4/1980 | Carlson | 427/39 |
| 4,202,928 | 5/1980 | Staebler | 427/39 |

Primary Examiner—John H. Newsome
Attorney, Agent, or Firm—Hill, Van Santen, Steadman, Chiara & Simpson

[57] ABSTRACT

Semiconductor bodies comprised of amorphous silicon are produced by sequentially depositing a plurality of amorphous silicon layers on a heat-resistant substrate by glow discharge in a silicon halide atmosphere at low pressures and low substrate temperatures, with each layer being hydrogenated with atomic hydrogen before deposition of the next subsequent layer. The semiconductor bodies thus produced are useful as basic or raw materials for fabricating solar cells.

8 Claims, 2 Drawing Figures

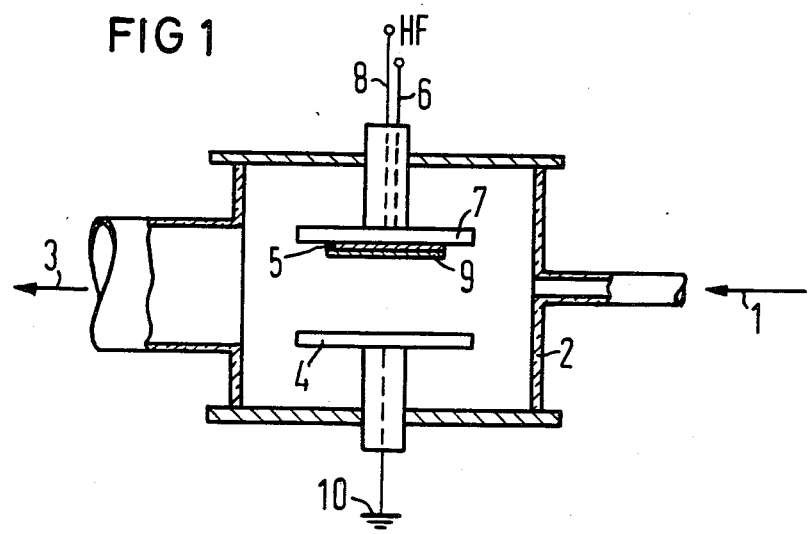
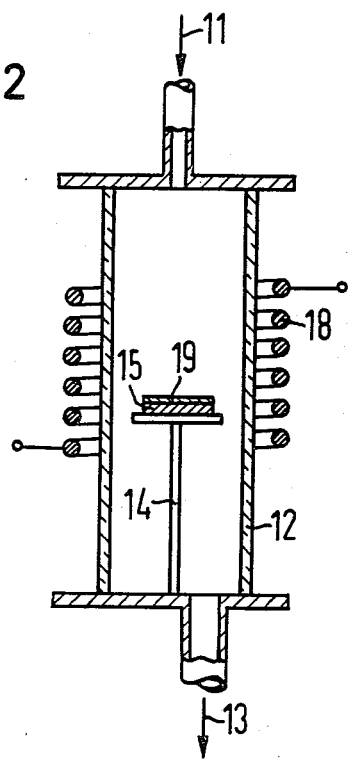

METHOD OF MANUFACTURING SEMICONDUCTOR BODIES COMPOSED OF AMORPHOUS SILICON

BACKGROUND OF THE INVENTION

1. Field of the Invention

The invention relates to methods of manufacturing semiconductor silicon bodies and somewhat more particularly to a process for producing amorphous silicon bodies via glow discharge and which are useful in fabricating solar cells.

2. Prior Art

In the manufacture of certain electrical components composed of silicon, such as solar cells, a silicon material can be used which does not have to meet as stringent requirements relative to its crystal quality and purity as is required in fabricating integrated semiconductor circuits. Because solar cells must be very economical in comparison to integrated semiconductor circuits in order to have broad application, (i.e., for miniature equipment in a watt range which is independent of a main power source or for generators in the KW-range which are also independent of a main power source) the manufacture of silicon bodies used as raw or base materials in fabricating solar cells must also be as simple and economical as possible.

Amorphous silicon (so-called a-Si) is an interesting and promising material for solar cell fabrication. Solar cells composed of this material are known, for example see U.S. Pat. No. 4,064,521 or German Offenlegungsschrift No. 27 43 141.

The method of producing amorphous silicon suggested by U.S. Pat. No. 4,064,521 comprises depositing an amorphous silicon layer having a thickness of about 1 μm on a sheet steel substrate via thermal decomposition of silane ($SiH_4$) in a low pressure plasma system. A Schottky-contact is fabricated on a surface of such layer by a subsequent vapor-deposition of a very thin metallic layer, such as a platinum layer. In order to achieve a relatively high efficiency (i.e., 5.5% has been achieved) in solar cells fabricated from such a-Si layers, it is necessary to incorporate atomic hydrogen into the silicon material. Apparently, atomic hydrogen saturates the free valences (sometimes referred to as "dangling" bonds) in amorphous silicon so that such valences or dangling bonds cannot function as recombination centers for charge carriers released by light. The incorporation of hydrogen in a-Si occurs simultaneously during the decomposition process of silane in a plasma reactor.

The method of producing amorphous silicon suggested by German Offenlegungsschrift No. 27 43 141 comprises decomposing a chlorinated or brominated silane, rather than the more expensive silane hydride ($SiH_4$). In this process, the deposition parameters are controlled in such a manner that the resultant amorphous silicon layer contains up to about 7 atomic percent of a halogen selected from the group consisting of Cl, Br and I as well as hydrogen for saturation and/or compensation of the free valences present in a-Si. A disadvantage of this process is that when the halogen content becomes too high, the electrical properties of the resultant amorphous silicon are negatively influenced and thus, the efficiency of solar cells fabricated from such material is substantially reduced.

SUMMARY OF THE INVENTION

The invention provides a process for increasing the efficiency of amorphous silicon used in fabricating solar cells and simultaneously provides a process of producing amorphous silicon bodies in an extremely economical manner. By following the principles of the invention, the efficiency of solar cells fabricated from amorphous silicon layers produced via the invention are optimized at an extremely low manufacturing cost.

In accordance with the principles of the invention, semiconductor bodies comprised of amorphous silicon are produced by sequential deposition of individual layers of amorphous silicon on a heat-resistant substrate via a glow discharge process in a suitable reactor containing a reaction gas which includes a gaseous silicon halide compound at relatively low pressure and at low substrate temperatures and, between each individual layer deposition, hydrogenating the deposited layer with atomic hydrogen in the same reactor and under the same pressure-temperature conditions used to deposit the amorphous silicon layers.

In preferred embodiments of the invention, chlorine-substituted silane compounds are utilized as gaseous silicon-source materials for the deposition of a-Si and at least three sequential a-Si layers are deposited one upon the other, with hydrogenation occurring between each such layer so as to achieve an overall a-Si thickness in the range of about 0.5 to 2 μm and preferably a thickness of about 1 μm. Amorphous silicon is preferably deposited on relatively cheap substrates, such as high grade steel, glass or a polyimide film, such as available under the registered trademark "KAPTON" film. In certain embodiments, a metal strip, for example composed of nickel or molybdenum, can be used as a deposition substrate so that such strip forms contact terminals (rear contacts) in subsequently fabricated solar cells.

In the practice of the invention, the glow discharge reaction gas contains a mixture of silicon-source material and hydrogen, preferably at a ratio greater than 1:1. The pressure of such glow discharge atmosphere is controlled so as to range between about 0.06 to 5 mbar. In the practice of the invention, the silicon-source materials are preferably silicon halides, such as silane monochloride ($SiHCl_3$) or silicon tetrachloride ($SiCl_4$), which are a factor of 10 cheaper than, for example, silane ($SiH_4$). When silane dichloride ($SiH_2Cl_2$) or silane monochloride ($SiH_3Cl$) are produced on a relatively large scale, a favorable price results so that an economically favorable deposition process is achieved by using these gaseous silicon-source materials. Further, gaseous bromine and fluorine silicon compounds can also be used for the same reasons.

BRIEF DESCRIPTION OF THE DRAWINGS

FIG. 1 is an elevated, partially cross-sectional, schematic view of a capacitive HF glow discharge reactor system useful in the practice of the invention; and FIG. 2 is somewhat similar view of an inductive HF glow discharge reactor system useful in the practice of the invention.

DESCRIPTION OF THE PREFERRED EMBODIMENTS

The invention provides an apparatus and method for producing semiconductor bodies comprised of amorphous silicon and which are useful as base or raw materials in fabricating highly efficient solar cells.

In accordance with the principles of the invention, a plurality of individual amorphous silicon layers are deposited one upon the other, with a hydrogenation via atomic hydrogen occurring between the deposition of each individual layer. The amorphous silicon deposition occurs via glow discharge at relatively low substrate temperatures on a heat-resistant substrate in a suitable reactor containing a gaseous silicon halide under relatively low pressures. The hydrogenation occurred within the same reactor and under substantially identical temperature-pressure conditions.

In accordance with the principles of the invention, hydrogenation occurs after the deposition of each relatively thin amorphous silicon layer so as to saturate the free valences (so-called "dangling" bonds) thereof. Such free valence saturation occurs particularly intensively on the surface of each layer so that in a sequence of layers, a higher hydrogen concentration is achieved inside the overall layered body. This results in more homogeneous distribution of hydrogen throughout the body thickness. These factors result in an improved efficiency of solar cells fabricated from such layered hydrogen-saturated amorphous silicon body.

Referring now to FIG. 1, which will be explained in conjunction with an exemplary method embodiment of the invention, a source (not shown) of a gaseous silicon compound, for example, comprised of a silicochloroform ($SiHCl_3$) is controllably fed through an inlet conduit (schematically illustrated by arrow 1) into a quartz reactor housing 2. The interior of the reactor housing 2, prior to introduction of the gaseous silicon compound, was first evacuated to a pressure of about $10^{-6}$ torr via a suitable vacuum pump (not shown), schematically indicated by arrow 3. Such evacuation is achieved by pumping with a heater unit 7 energized. When the reaction gas, which consists of a mixture of silico-chloroform and hydrogen in a ratio of $SiHCl_3:H_2$ equal to about 1:2, attains a flow through-rate of about 5 1/hr, a substrate 5, which, for example, consists of a galvanized high grade steel plate, which is suitably attached onto the heater unit or electrode 7, is heated to a temperature of about 200° to 300° C. by means of energy, such as an HF-source coupled to the electroded 7 via leads 8 and 6. When HF energy is fed in, the glow discharge between a grounded electrode 4 and the substrate 5 and electrode 7 commences and the deposition of a first amorphous silicon layer 9 on the substrate begins. In an exemplary process, the HF-power was set at 10 watts and the plasma gas pressure within the reactor housing 2 was set at 0.5 mbar. Electrode 4 is grounded at 10. After approximately 10 minutes, the deposition was interrupted by shuttingoff the supply of gaseous silicon compounds and flushing the reactor with hydrogen so that hydrogenation of the deposited amorphous silicon layer 9 took place via atomic hydrogen, which formed within the reactor housing via the glow discharge process. After a further 10 minute interval, the control valve for the gaseous silicon compound was re-opened and a further amorphous silicon layer (not shown, but substantially identical the layer 9) was deposited on the free surface of layer 9. This procedure was then repeated an additional three times, and following each deposition, a hydrogenation process occurred to saturate the free valences of the newly-deposited amorphous silicon with atomic hydrogen.

Following a fifth sequence of amorphous silicon deposition and hydrogenation, the layered amorphous silicon body present on the substrate 5 attained, for example, a layer thickness of about 1 $\mu$m. Such a-Si body can then be further processed, together with a substrate 5, to form a solar cell via known production processes (involving production of pn-junctions, Schottky contacts or inversion layers, production of antireflection layers, etc., via vapor deposition and masking techniques).

Referring now to FIG. 2 wherein an inductive reactor system is illustrated, a reaction gas ($SiHCl_3 + H_2$) is introduced into a reactor housing 12. The reactor housing 12 is provided with a valve-controlled gas inlet 11 and a valve-controlled gas outlet 13, which may simultaneously function as a vacuum-pump terminal. The reactor housing 12 can, for example, be a quartz tube surrounded by a multi-winding induction coil 18 and appropriately coupled to an energy source. A substrate 15 positioned on a holder 14 is provided within the reactor housing 12 and in the path of the gas stream between the gas inlet 11 and the gas outlet 13. Upon activation, a glow discharge occurs and an amorphous silicon layer 19 is deposited on the substrate 15, which may, for example, comprise a contact metal strip or a Kapton film coated with a conductive coating. The operating parameters used for depositing layer 19 can be substantially identical to those set forth in the exemplary embodiment discussed in conjunction with FIG. 1. Here again, a sequentially layered deposition of amorphous silicon layers and hydrogenation of the free valences present in each of such amorphous silicon layers occurs for at least three sequences.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

We claim as our invention:

1. A process for producing semiconductor bodies comprised of amorphous silicon and useful for fabrication of solar cells, comprising:
    sequentially depositing a plurality of individual amorphous silicon layers onto a heat-resistant substrate via a glow discharge at temperatures in the range of about 200° to 300° C. and in an enclosed chamber containing a reaction gas at a pressure in the range of about 0.06 to 5 mbar, said gas including a gaseous silicon halide compound; and
    hydrogenating each individual amorphous silicon layer with atomic hydrogen in the same enclosed chamber and at substantially identical temperature-pressure conditions used to deposit such layer before depositing a subsequent amorphous silicon layer.

2. A process as defined in claim 1 wherein said gaseous silicon halide compound comprises a chlorine-substituted silane compound.

3. A process as defined in claim 1 wherein at least three sequential amorphous silicon layers are sequentially deposited on one another with hydrogenation of each layer occurring before deposition of a subsequent layer.

4. A process as defined in claim 3 wherein the combined thickness of all of the deposited amorphous silicon layers is in the range of about 0.5 to 2 $\mu$m.

5. A process as defined in claim 4 wherein said combined thickness is about 1 μm.

6. A process as defined in claim 1 wherein said heat-resistant substrate is selected from the group consisting of a high grade steel plate, a glass plate provided with a conductive layer and a polyimide film.

7. A process as defined in claim 1 wherein said substrate comprises a metal strip capable of functioning as a contact terminal (rear contact) for subsequently fabricated solar cells.

8. A process as defined in claim 1 wherein said reaction gas atmosphere contains a mixture of a gaseous silicon halide compound and hydrogen at a ratio equal to about 1:2.

* * * * *